United States Patent [19]

Lynch et al.

[11] Patent Number: 4,896,108

[45] Date of Patent: Jan. 23, 1990

[54] TEST CIRCUIT FOR MEASURING SPECIFIC CONTACT RESISTIVITY OF SELF-ALIGNED CONTACTS IN INTEGRATED CIRCUITS

[75] Inventors: William T. Lynch, Summit; Kwok K. Ng, Berkeley Heights, both of N.J.

[73] Assignee: American Telephone and Telegraph Company, AT&T Bell Laboratories, Murray Hill, N.J.

[21] Appl. No.: 224,512

[22] Filed: Jul. 25, 1988

[51] Int. Cl.⁴ .................. G01R 31/26; G01R 27/14
[52] U.S. Cl. .................. 324/158 T; 324/713; 324/73.1
[58] Field of Search ............. 324/158 T, 73 R, 158 R, 324/64, 158 D

[56] References Cited

U.S. PATENT DOCUMENTS

| 4,517,225 | 5/1985 | Broadbent | 427/87 |
| 4,542,340 | 9/1985 | Chakravarti et al. | 324/158 R |
| 4,628,144 | 12/1986 | Burger | 324/64 |
| 4,706,015 | 11/1987 | Chen | 324/64 |
| 4,789,825 | 12/1988 | Carelli et al. | 324/158 T |

OTHER PUBLICATIONS

J. G. Chern, "Determining Specific Contact Resistivity from Contact End Resistance Measurements," IEEE Electron Device Letters, vol. EDL-5, pp. 178–180 (1984).
W. M. Loh, K. Saraswat, R. W. Dutton, "Analysis and Scaling of Kelvin Resistors for Extraction of Specific Contact Resistivity," IEEE Electron Device Letters, vol. EDL-6, pp. 105–108 (1985).
T. J. Faith, R. S. Irven, S. K. Plante, J. J. O'Neill, Jr., "Contact resistance: Al and Al-Si to diffused N+ and P+ silicon," J. Vac. Sci. Technol., pp. 443–448 (1983).
S. J. Proctor, "A Direct Measurement of Interfacial Contact Resistance," IEEE Electron Device Letters, vol. EDL-3, pp. 294–296 (1982).

Primary Examiner—Ernest F. Karlsen
Attorney, Agent, or Firm—David I. Caplan

[57] ABSTRACT

A test circuit is described for measuring the specific contact resistivity $r_c$ of self-aligned electrodes contacting underlying diffused regions at a major surface of an underlying semiconductor wafer, as well as the sheet (lateral) resistance $r_s$ of the underlying diffused regions in some embodiments. The test circuit illustratively includes a pair of test MOS or other type of transistors advantageously made by a self-aligned metallization process simultaneously with the other MOS or other type of transistors to be tested. The two test transistors share a common diffused region, a self-aligned common controlled electrode contacting a diffused region underneath it, and a common control electrode. During test operation, both test transistors are kept ON by means of an applied above-threshold control voltage, while a current source forces current through one of the transistors. The resulting voltage, developed across the common controlled electrode and the controlled electrode of the other transistor is a measure of the specific contact resistivity thereat.

19 Claims, 3 Drawing Sheets

TEST CIRCUIT FOR MEASURING SPECIFIC CONTACT RESISTIVITY OF SELF-ALIGNED CONTACTS IN INTEGRATED CIRCUITS

FIELD OF INVENTION

This invention relates to semiconductor integrated circuit wafers and more particularly to test circuits for measuring the specific contact resistivity of electrodes contacting the semiconductor wafer.

BACKGROUND OF THE INVENTION

The design rules for minimum line width (minimum feature size) of semiconductor integrated circuits are presently progressing to values below one micrometer. Accordingly, technologies featuring self-aligned metal silicide contact electrodes, or other self-aligned metallization contact electrodes, serving as the high-current-carrying (controlled) transistor terminals (source and drain terminals in unipolar transistors, emitter and collector in bipolar transistors) become increasingly attractive commercially, primarily by virtue of the reduced series resistance of the transistors. The self-alignment of the high-current-carrying contact electrodes is in general in addition to self-alignment of control electrodes, i.e., the low-current-carrying transistor terminals (gate terminals in unipolar transistors, base terminals in bipolar transistors).

An important self-aligned electrode contact technology, the self-aligned silicide MOS technology, illustrates quite clearly the problems arising from fabricating test circuits for measuring specific contact resistivity, $r_c$ (measured in units of ohm-cm$^2$, for example). For the sake of definiteness, first the self-aligned silicide MOS technology will be discussed in detail, but it should be understood that similar problems arise in other self-aligned electrode contact technologies, such as self-aligned metallization by means of selective tungsten metal deposition (without forming silicide) using low pressure chemical vapor deposition techniques—as taught, for example, in U.S. Pat. No. 4,517,225, issued to E. K. Broadbent on May 14, 1985, entitled "Methods for Manufacturing an Electrical Interconnection by Selective Tungsten Deposition"—which can be used for making self-aligned metallization electrode contacts for MOS transistors, for MESFETs (metal gate field effect transistors), or for bipolar transistors. In the self-aligned silicide MOS technology, each of the MOS transistor source-drain contact electrodes is composed of a metal silicide layer in physical contact, and hence in electrical contact, with a diffused source or drain region at a top major surface of an underlying silicon wafer. Moreover, these metal silicide source-drain electrodes are formed by deposition of the metal, followed by sintering of the deposited metal to form metal silicide wherever silicon (including exposed silicon of a silicon gate, if any) underlies the metal at a time when the sidewalls of the gate electrode are coated with a protective insulating layer, typically a sidewall oxide layer, whereby each of the resulting metal silicide source-drain contact electrodes automatically has an edge which is laterally displaced from an edge of the nearest gate electrode only by the thickness of the sidewall oxide layer. Thus each metal silicide source-drain electrode is self-aligned; that is, no extra lithographic step was required thus to align an edge of each source-drain electrode with an edge of the gate electrode: the alignment was automatically determined by the thickness of the sidewall oxide. Furthermore, since the thickness of the sidewall oxide is small relative to the minimum feature size, the lateral displacement of the silicide electrode edge relative to the gate electrode edge is relatively small.

Also, in self-aligned silicide MOS technology, significant impurities, donors or acceptors, or both—to form the MOS transistor source-drain diffused regions located in surface portions of the silicon wafer underlying th metal silicide source-drain electrodes—are introduced into and diffused in the silicon wafer either before or after the deposition of the metal. In either event, the eges of the source-drain diffused regions are thus themselves self-aligned with respect to the corresponding edges of the gate electrode, but are laterally displaced therefrom at slightly different distances from those of the source-drain electrodes, depending upon the specific source-drain diffusion conditions and parameters thereof.

Now, in accordance with the ordinary silicon integrated circuit (IC) fabrication procedures, including those used in self-aligned silicide technology, the circuits corresponding to a plurality of IC chips are all simultaneously fabricated on a single silicon wafer. When fabrication of all the integrated circuits on the silicon wafer has been completed, the wafer is scribed and cut up into the plurality of IC chips. Similar procedures can be employed in other MOS self-aligned metallization technologies, as well as in MESFETs and in bipolar transistors made in silicon or in gallium arsenide semiconductor.

Many are the causes and types of failure mechanisms in IC chips, and failures in self-aligned silicide technology, as well as in other self-aligned metallization technologies, are no exception. Some of these failure mechanisms—both in self-aligned-silicide technology and in other, non-self-aligned silicide technologies—fortunately can be detected at a relatively early stage of fabrication, so that upon such early detection of a failure mechanism, fabrication can be terminated before all IC fabrication steps have been completed or at least before the wafer is scribed and cut into individual chips, depending upon when the failure is detected. Thus economic costs of failures can be reduced. One technique for achieving this early detection of failures is the utilization of test circuits integrated in non-IC-chip areas (test circuit areas) of the wafer—i.e., areas located between future chips, areas located at the periphery of the wafer, as well as any other areas of the wafer where no workable chips are to be fabricated. Specifically, these non-IC-chip areas are utilized for the fabrication of the test circuits by means of, for example, self-aligned silicide processing which is performed simultaneously with the same self-aligned silicide processing of the chip circuits integrated in IC chip areas, viz., areas where the ultimately desired IC chips are to be located on the wafer. By virtue of this simultaneous fabrication of chip circuits and test circuits, the semiconductor processing parameters of test circuits and chips circuits are automatically virtually the same (except for negligible processing variations across the surface of the wafer). Hence, the device parameters—such as specific contact resistivity $r_c$ of electrode contacts to diffused regions of the semiconductor wafer and sheet (lateral) resistivity $r_s$ of the diffused regions—are also automatically virtually the same for the test circuits as for the chip circuits. Indirect testing of the chip circuits by means of direct testing of the test circuits thus becomes feasible and meaningful at an early stage of manufacture. The same tests can be deferred, however, until the entire manufacturing process is completed, especially in those cases where failures are expected at late stages of manufacture.

An important failure mechanism in integrated circuits, both in self-aligned and in non-self-aligned metallization technologies, is manifested by unduly high specific contact resistivity $r_c$ of electrodes to underlying diffused regions.

A desirably compact test circuit 1000 (FIG. 1) in the prior art for measuring this specific contact resistivity in non-self-aligned metallization technology is taught, for example, in "Determining Specific Contact Resistivity From Contact End Measurements" by J. G. J. Chern et al, published in *IEEE Electron Device Letters*, volo EDL-5, pp. 178-180 (1984).

Figure 1:
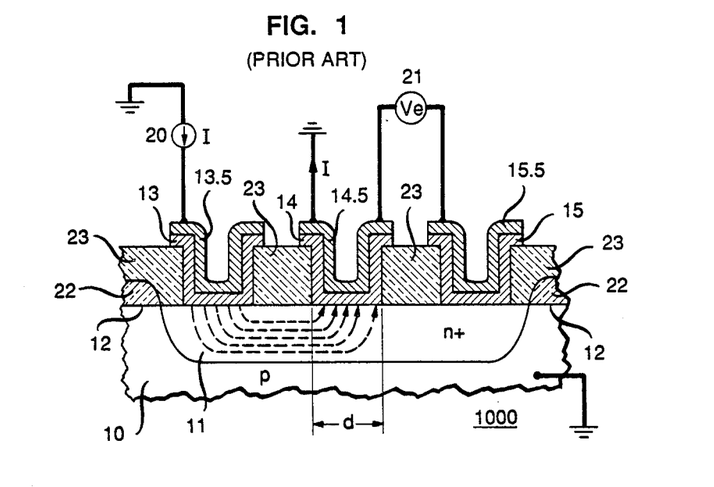
FIG. 1 is a cross-section diagram of a prior-art test circuit for measuring specific contact resistivity.

In the test circuit 1000, illustratively for n-channel MOS transistors, a p-type crystal silicon semiconductor wafer 10 has an n+ type diffused region 11 located at a top major surface 12 of the wafer 10 where each of three mutually spaced-apart contact electrodes 13, 14, 15 make contact with the top exposed surface of the n+ diffused region 11 at mutually spaced-apart areas. The middle contact electrode 14 intervenes between the other two electrodes 13 and 15. These contact electrodes 13, 14, and 15—typically polycrystalline silicon or Ti:W alloy—serve as barrier layers for overlying aluminum metallization layers 13.5, 14.5, and 15.5 respectively. A field oxide layer 22 and a phosphorus-glass layer 23 complete the test circuit 1000.

During operation, a current source 20 is connected to deliver current I to the electrode 13 while the electrode 14 (in the middle) is grounded and a voltage detector is connected across electrodes 14 and 15. The resulting nonuniform electrical current distribution in the diffused region 11 is indicated in FIG. 1 by a set of broken line arrows representing the current direction and density. Because of the relatively high electrical conductivity of the electrodes 13, 14, and 15, the potential difference between opposite edges of each electrode is negligible. In response to the current I, a voltage $V_e$ is developed between electrodes 14 and 15. This voltage $V_e$ is known to be a measure of the sheet resistance per square $r_s$ of the diffused region 11 and of the specific contact resistivity $r_c$ between the middle electrode 14 and the diffused region 11:

$$V_e = I(r_s r_c)^{\frac{1}{2}}/W \sin h \, [d(r_s/r_c)^{\frac{1}{2}}] \quad (1)$$

where W is the width (perpendicular to the plane of the paper) of the contact of the electrode 14 to the diffused region 11, and d is the length of such contact. See, for example, the above-mentioned paper by J. G. J. Chern et al, at p. 178, col. 2, paragraph 1. By fabricating in the wafer 10 two (or more) such test circuits 1000 with mutually different values of electrode length d, but with the same values of all other parameters, the specific contact resistivity $r_c$ can be calculated by measuring the resulting voltages $V_e$ for the different test circuits and by iteratively applying eq (1) to the two (or more) such circuits 1000 and solving for the two unknown $r_s$ and $r_c$.

It is also known in prior art that eq. 1 can be simplified by using an L-shaped layout of the diffused region 11, as shown in a paper entitled "Analysis and Scaling of Kelvin Resistors for Extraction of Specific Contact Resistivity" authored by W. M. Loh et al, published in IEEE Electron Device Letters, vol. EDL-6, pp. 105-108 (1985). In the case of the L-shaped layout, it was shown that the specific contact resistivity $r_c$ is given simply by $$r_c = V_s W d / I \quad (2)$$

where $V_s$ is the voltage measured by the voltage measuring device 21. Thus, but a single measurement of voltage enables determination of the specific contact resistivity $r_c$ (but not the sheet resitance $r_s$).

In the self-aligned silicide MOS process described above, it is likewise desired to measure the specific contact resistivity $r_c$ of the metal silicide source-drain electrodes to the underlying wafer, as well as perhaps the sheet resistance $r_s$. However, it is not possible to fabricate the circuit 1000 with the three self-aligned silicide electrodes contacting the diffused region 11 of the underlying silicon wafer 10 simultaneously and compatibly with fabrication of the chip circuits (i.e., with no extra lithography steps, which can change the contact resistance), because in the self-aligned silicide process for making, say, n-channel transistors, there is a single metal silicide source-drain electrode directly overlying each diffused n+ region of the wafer 10. In other words, in any self-aligned metal silicide technology each diffused n+ region is completely covered by one continuous layer of metal silicide having a relatively high conductivity as compared with that of the diffused region. Thus the current flowing between contacts 13 and 14 would tend to be confined within the metal silicide layer with very little current flowing from the metal silicide layer into the diffused region—where $r_s$ is to be measured—via the interface between the metal silicide layer and the diffused region where the specific contact resistivity $r_c$ is to be measured. Only by means of an added lithography step could the continuity of the self-aligned metal silicide layer be broken in order to force the current from the silicide layer into the n+ diffused region in order to measure $r_c$ and $r_s$ properly. Such added lithography, however, would change the processing sequence in the test circuits so that the properties of the silicide-silicon interface, and hence the value of $r_c$ in the test circuit, would no longer be necessarily the same as those of the integrated circuits being measured by the test circuit. Thus the measurement of $r_c$ by the test circuit would no longer be meaningful.

Similar problems associated with an added lithography step required for test circuits arise in any other self-aligned metallization contact electrode technology.

SUMMARY OF THE INVENTION

To solve the foregoing problem, a test circuit is devised which is useful for measuring the specific contact resistivity $r_c$ of the interface between self-aligned metallization electrode contacts and diffused regions of an underlying semiconductor wafer, as well as in some specific embodiments for meausuring the sheet resistance $r_s$ of the diffused regions, but which does not require an added lithography step. The test circuit is located at a major surface of the semiconductor wafer and comprises:

(a) first, second, and third contact electrodes contacting the major surface of the wafer at first, second, and third mutually spaced-apart areas thereof;

(b) first, second, and third mutually spaced-apart diffused regions of the wafer contacted by the first, second, and third contact electrodes, respectively;

(c) first and second control electrodes overlying first and second channel regions, respectively, of the major surface, the first channel region situated in the space between the first and second spaced-apart areas, and the second channel region situated in the space between the second and third spaced-apart areas;

(d) voltage source means connected to the first and second control electrodes, for causing first and second inversion layers, respectively, to form at the major surface of the wafer in the first and second channel regions, respectively;

(e) current source means, connected to the first or the second contact electrode, for causing a flow of current through the first diffused region, the first inversion layer, and the second diffused region;

(f) voltage detection and measuring means, connected across the second and third contact electrodes, for measuring the voltage developed across the second and third contact electrodes in response to the flow of current.

Figure 2:
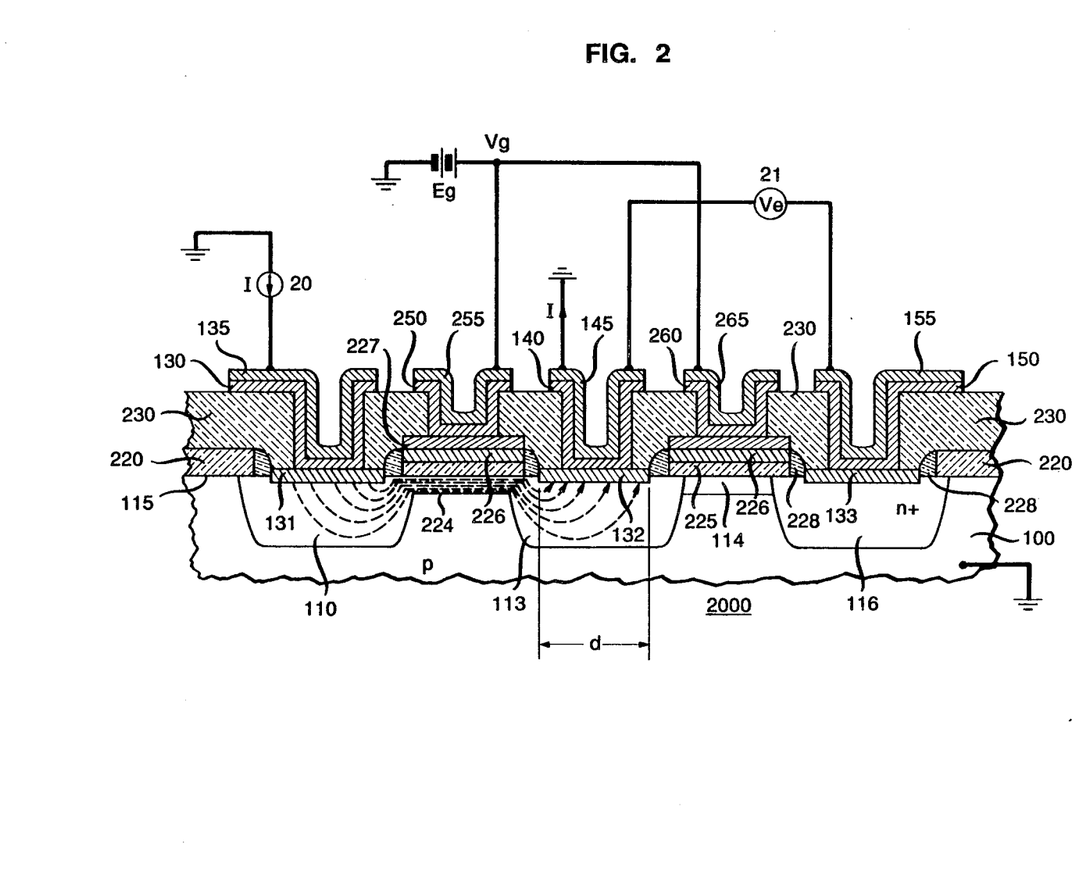
FIG. 2 is a cross-section diagram of a test circuit in accordance with an illustrative embodiment of the invention, for measuring specific contact resistivity of self-aligned metal silicide electrodes.

In one embodiment (FIG. 3) the layout of the test circuit of this invention is such that the three source-drain electrodes lie along a straight-line path; in another embodiment (FIG. 4), along an L-shaped path. The straight-line path layout, however, suffers from a disadvantage, to wit, a loss in voltage sensitivity in the measurement of $V_e$ because of current crowding at the front end (near end; left-hand end) of the middle electrode 132, as indicated in FIG. 2, whereby the current density at the rear (far; right-hand) end thereof, where $V_e$ is measured, becomes relatively small. On the other hand, the L-shaped layout does not suffer from such a loss of voltage sensitivity despite current crowding, if any, because the voltage measuring device measures an average voltage—viz., the voltage under the middle electrode averaged over its entire length d—the measurement of which is not adversely affected by any current crowding. However, the L-shaped layout does not enable measurement of $r_s$, the resistance of the diffused region. On the other hand, the linear layout enables determination of both $r_s$ and $r_c$, provided that at least two such linear layouts have different values of middle electrode length d.

BRIEF DESCRIPTION OF THE DRAWING

This invention, together with its features, characteristics, and advantages may be better understood from the following detailed description when read in conjunction with the drawing in which.

The broken lines 2—2 in FIG. 3 and FIG. 4 indicate the sections thereof depicted in FIG. 2. The hatched lines in FIGS. 3 and 4 represent self-aligned metal silicide electrodes. Only for the sake of clarity, none of the figures is drawn to scale.

DETAILED DESCRIPTION

As shown in FIG 2, in accordance with an illustrative embodiment of the invention a test circuit 2000 is integrated in a p-type semiconductor wafer 100 at a major surface 115 thereof. It should be understood that the wafer 100 also includes integrated chip circuits (not shown) to be tested and cut from the wafer 100, as well as perhaps other test circuit structures (not shown) for measuring other parameters of the chip circuits and one or more test circuits (not shown) similar to the test circuit 2000 except (perhaps) for differing lengths d of contact of the middle contact electrode(s) 132 to underlying n+ diffused region(s) 113. It should also be understood that the wafer 100 need be p-type only in a top portion thereof, and can be n-type in a bottom portion. For example, the p-type top portion can be epitaxially grown on an n-type bottom portion of the wafer, or the p-type top portion can be a p-tub, as known in the art. The circuit 2000 is fabricated in accordance with a standard MOS self-aligned source-drain electrode metallization technology.

More particularly, as shown in FIG. 2, within a GASAD (gate and source and drain) region are located three source-drain metallization contact electrodes 131, 132, and 133, as well as those portions of a gate electrode layer 226 which overlie a gate insulating layer 225 (FIG. 2). The gate electrode layer 226 is illustratively polycrystalline silicon; the gate insulating layer 225 is illustratively silicon dioxide ("gate oxide"); and the source-drain electrodes 131, 132, and 133 are illustratively metal silicide, such as cobalt silicide.

The circuit 2000 further includes three spaced-apart n+ source-drain diffused regions 110, 113, and 116 underlying the metal silicide source-drain electrodes 131, 132 and 133, respectively. An aperture in a field oxide layer 220, having its sidewalls coated with portions of a sidewall oxide layer 228, defines the edges of the GASAD region within which are situated the three diffused source-drain regions 110, 113, 116, as well as the gate oxide layers 225. This gate oxide 225 intervenes both between the spaced-apart metal silicide source-drain electrodes 131 and 132 and between spaced-apart metal silicide source-drain electrodes 132 and 133. Upon the gate oxide layer 225 is located the polycrystalline silicon ("polysilicon") gate electrode layer 226; and upon this polysilicon gate electrode layer 226 is located metal silicide gate metallization layer 227. This metal silicide gate metallization layer 227 can be formed simultaneously with the metal silicide source-drain electrodes 131, 132, and 133 in accordance with the self-aligned silicide process, as more fully described below. The sidewalls of the polysilicon gate electrode 226 are coated with other portions of the sidewall oxide layer 228.

The circuit 2000 is coated with a phosphosilicate glass (P-glass) layer 230, except for apertures therein for contact therethrough by barrier metallization layers 130, 140, 150—such as TiW—to the metal silicide source-drain electrodes 131, 132, and 133, respectively, and for contact by barrier metallization layer 250 and 260 to the metal silicide gate layer 227. These barrier metallization layers 130, 140, 150, 250 and 260 are typically coated with aluminum metallization electrode layers 135, 145, 155, 255 and 265 respectively.

The metallization layer 135 terminates in a pad 301 (FIG. 3), to which the current source 20 is connected. This metallization layer 135 penetrates down through an aperture 313 (FIG. 3) in the P-glass layer 230 (FIG. 2), for establishing electrical contact to the metal silicide source-drain layer 131.

The metallization layer 145 terminates at opposite extremities thereof in pads 302 and 305, respectively, to which a ground sink for the current I is connected and to which one terminal of the voltage measuring device 21 is connected. This metallization layer 145 penetrates down through an aperture 314 (FIG. 3) for establishing electrical contact to the metal silicide source-drain electrode 132.

The metallization layer 155 terminates in a pad 304 to which another terminal of the voltage measuring device 21 is connected. This metallization layer 155 penetrates down through an aperture 315 in the phosphorus doped glass (P-glass) layer 230, for establishing electrical contact to the metal silicide source-drain electrode 133. The gate electrode 226 is contacted by metallization layer 255 through an aperture 312 (FIG. 3) in the P-glass layer 230, and this metallization layer 255 terminates in a pad 303 to which the voltage $V_g$ is applied by voltage source $E_g$.

The current source 20 thus applies a current I to the aluminum metallization layer 135. The voltage source $E_g$ applies a voltage $V_g$ to the gate metallization 255, and this voltage is selected to be sufficient to create inversion layers 224 and 114 (FIG. 2) located in the channels at the major surface 115 of the wafer 100 beneath the pair of gate oxide layers 225. That is, the applied voltage $V_g$ is greater than the threshold voltage.

The aluminum metallization layer 145 is thus connected directly to ground—whereby the current I flows serially through the aluminum and barrier metallization layers 135 and 130, the metal silicide electrode 131, the n+ diffused region 110, the inversion layer 224, the n+ diffused region 113, the metal silicide electrode 132, and the metallization layers 140 and 145 to ground.

The voltage measuring device 21 is thus connected across aluminum metallization layers 145 and 155, for measuring the voltage $V_e$ developed across the metal silicide source-drain electrode 132; and the right-hand edge of the diffused region 113—i.e., that edge of the diffused region 113 which is closest to the diffused region 116. In turn, the voltage at the right-hand edge of the diffused region 113 is substantially the same as the voltage of metallization electrode 155, owing to the path of relatively low resistance (as compared with the input resistance of the voltmeter 21) from the right-hand edge of the diffused region 113 through the inversion layer 114, the diffused region 116, the thickness of the metal silicide layer 133, and the barrier metallization layer 150 to the voltmeter 21.

Figure 3:
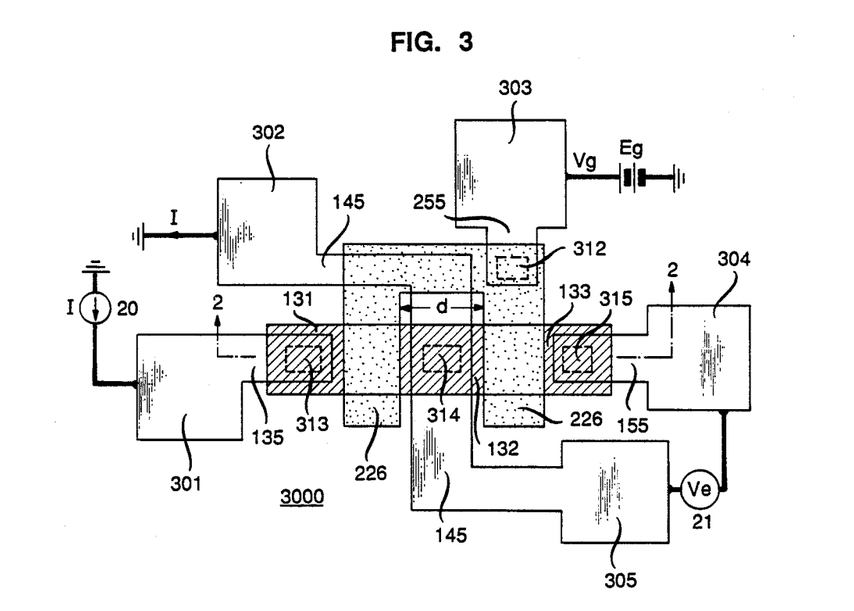
FIG. 3 is a top view layout diagram of the circuit shown in FIG. 2.
Figure 4:
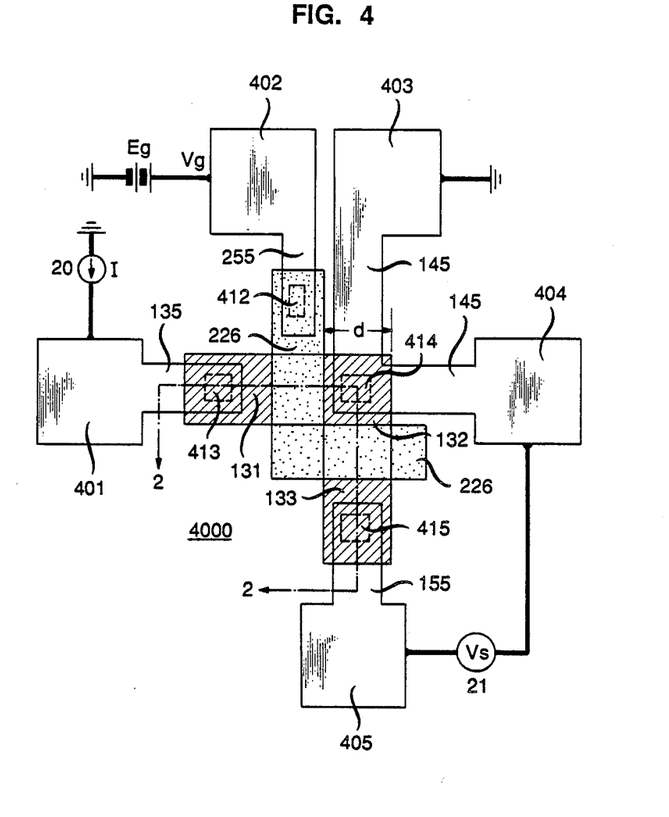
FIG. 4 is a top view layout diagram of a folded (L-shaped) layout embodiment of the circuit shown in FIG. 2.

It should be understood, as more clearly appears by inspection of FIG. 3 or FIG. 4, that external contact to the polysilicon and metal silicide gate layers 226 and 227 are represented only symbolically in FIG. 2, in that the apertures for contact thereto in fact are often located over field oxide and not over gate oxide. That is, these layers 226 and 227 often run beyond the gate-and-source-and-drain (GASAD) region to areas overlying field oxide for contact thereto by the barrier metallization layers 250 and 260 overlaid with the aluminum metallization layers 255 and 265.

It is clear by inspection that the circuit 2000—except for the external electrical paraphernalia, i.e., except for the current source 20, the voltage $V_g$, and the voltage measuring device $V_e$—is the equivalent of two back-to-back MOS transistors sharing a common source-drain region 113. The circuit 2000 can therefore be fabricated by the self-aligned silicide process compatibly and simultaneously with fabrication by the same self-aligned silicide process of the MOS transistors in the chip circuits on the same wafer 100. More particularly and illustratively, to fabricate the circuit 2000, first the field oxide layer 220 is formed and lithographically patterned to define the gate-and-source-and-drain (GASAD) region. Next a gate oxide layer is thermally grown (but not necessarily yet patterned) in the GASAD region, and a polysilicon gate electrode layer is deposited thereon. The polysilicon gate electrode and gate oxide layers are then lithographically patterned to form the polysilicon gate electrode layer 226 and the gate oxide layer 225, whereby the major surface of the wafer 100 is exposed everywhere else in the GASAD region.

Next the sidewall oxide layer 228 is deposited or is thermally grown, particularly on the sidewalls of the polysilicon gate electrode layer 226. A sidewall oxide layer may also appear on the sidewalls of the field oxide layer 220 in case the sidewall oxide is deposited rather than grown. Then a metal, such as cobalt is deposited and sintered to form metal silicide in regions overlying silicon and polysilicon, and the remaining (non-silicided) metal on the field oxide and sidewall oxide layers 220 and 228 itself is removed typically by a liquid etch that removes the metal but not the metal silicide, whereby metal silicide remains overlying the exposed portion of the major surface of the wafer 100, in the GASAD region, as well as overlying the polysilicon gate electrode layer 226. (The simultaneous formation of silicide on the gate electrode can be suppressed, if desired, by an oxide layer on the top of the gate electrode.) Thus metal silicide source-drain electrodes 131, 132 and 133, as well as metal silicide gate layer 227, are automatically formed in a self-aligned fashion, i.e., without further lithographic patterning. Diffused regions 110, 113, and 116 can be formed by introducing suitable impurities just before or after formation of the metal silicide electrodes 131 132, 133. Then the phosphosilicate glass layer 230 is deposited everywhere and apertures formed therein by lithographic patterning. Next the barrier metallization layers 130, 140, 150, 250 and 260, and the aluminum metallization layer 135, 145, 155, 255 and 265 are deposited and lithographically patterned, to complete the circuit 2000, except for attachment of the external electrical paraphernalia—i.e., the current source 20, the applied gate voltage $V_g$, and the voltage measuring device 21.

The transistors (not shown) of the integrated circuits located on chip areas of the wafer 100—i.e., the transistors to be tested—are advantageously fabricated simultaneously with the fabrication of the circuit 2000, as are their respective metallizations.

During operation, the voltage $V_e$ measured by the device 21 satisfies eq. 1 above, with d being the length of the middle source-drain electrode 132. Since there are two unknowns, $r_c$, and $r_s$, in eq. 1, at least two measurements of $V_e$ for a given current I but different values of d are needed to calculate $r_c$ and $r_s$. Thus, at least two test structures 2000 having differing d are needed to measure the specific contact resistivity $r_c$.

FIG. 4 shows the layout 4000 of a folded L-shaped embodiment of the circuit 2000 (FIG. 2). Here in FIG. 4 the GASAD region—including the source-drain electrodes 131, 132, and 133, and the localized areas of the major surface of the wafer 100 (FIG. 2) underlying the gate electrode 226 (in regions of gate oxide)—has the configuration of an "L" shape; as does the gate electrode 226, 227. Pads 401, 402, 403, 404, and 405 serve similar functions in the layout 4000 (FIG. 4) as do pads 301, 303, 302, 305, and 304, respectively, in the layout 3000 (FIG. 3); and apertures 412, 413, 414, and 415 (FIG. 4) serve the same function as do apertures 312, 313, 314, and 315 in the layout 3000 (FIG. 3), respectively. In this way, the voltage measuring device 21 indicates $V_s$ instead of $V_e$, with $V_s$ given by eq. 2 above.

Thus, as noted above, according to eq. 2 the layout 4000 enables measurement of specific contact resistivity through eq. 2 by means of but a single measurement. It should be noted that $V_e$ (FIG. 3) in eq. 1 is the same as the voltage at the rear end of the n+ diffused region 113, i.e., the edge of the region 113 most remote from the source drain region 110, whereas $V_s$ (FIG. 4) in eq. 2 is the average voltage (from left to right) taken at the side edge of the n+ diffused region 113. It is believed that the reason for these properties of $V_e$ and $V_s$, respectively, is that the voltage on the metal-silicide source-drain electrode 133 is equal to the voltage at the rear (right-hand) edge of region 113 in the layout 3000 of FIG. 3, but is equal to the average voltage at the bottom edge of the region 113 (averaged from left to right) in the layout 4000 of FIG. 4, because there is substantially no current flow in either case between the metal-silicide electrode 133 and the region 113 and hence substantially no voltage difference therebetween.

The circuit 2000 has been actually tested in the layouts 3000 and 4000 shown in FIGS. 3 and 4, and it has been found to operate properly.

Although the invention has been described in detail with reference to terms of specific embodiments, various modifications can be made without departing from the scope of the invention. For example, instead of n+ diffused regions for the source-drain regions in p-type bodies, diffused regions that have p+ conductivity can be used in conjunction with n-type wafers or n-type epitaxial layers or n-tubs. Instead of cobalt silicide for the metal silicide source-drain electrodes, other silicides can be used such as silicides of titanium, tantalum, tungsten and platinum.

The width by length (W by d) dimension of each of the metal silicide source-drain contact electrodes 131, 132, and 133, as well as that of the gate oxide 225, is typically about 3×5, or 3×3, or 5×3 micrometers in the circuit 4000, and about 10×2.5 or 10×4 micrometers in the circuit 3000. The current source is typically in the range of about $10^{-2}$ to $10^{-7}$ amperes, and the resulting voltages $V_e$ and $V_s$ are in the range of about $10^{-2}$ to $10^{-7}$ volt. In order to measure such small voltages in the presence of unavoidable noise, especially those voltages of the order of $10^{-5}$ volt or less, an A.C. current I is used typically having a frequency of about 100 Hz in conjunction with a voltage measuring device comprising a lock-in differential amplifier to measure the signal.

Although the gate electrodes 226, overlying the two channels 114 and 224, are shown in FIGS. 2, 3, and 4 as being directly connected to each other and to a voltage source $E_g$, these gate electrodes could be separately connected to different voltage sources each of which is above threshold voltage. Moreover instead of self-aligned metal silicide source-drain contact electrodes, other suitable self-aligned metallization contact electrodes could be used, such as contact electrodes of tungsten or molybdenum that have been selectively deposited by low pressure chemical vapor deposition, or contact electrodes of copper, nickel, or gold that have been selectively deposited by electroplating, or contact electrodes of platinum, copper, nickel, or gold that have been selectively deposited by electroless plating. The wafer 100 could be single crystal or polycrystalline silicon, or other Group IV or III-V semiconductor, in conjunction with other types of transistors such as MESFETs and bipolar transistors. The gate electrode layer 226 could also be any suitable metal or conducting metal compound, and the gate oxide layer could also be any suitable dielectric material. The current source 20 alternatively can be attached to metallization layer 145 while metallization layer 135 is grounded.

Finally, it should be understood that the current source 20 need not have infinite impedance but that any convenient finite impedance source of curent can be used such as a battery of suitable electromotive potential, typically about 5 volts, with or without a series resistance to control the current.

What is claimed is:

1. A semiconductor integrated circuit wafer including chip circuits and a test circuit located at a major surface of the semiconductor wafer, the test circuit comprising:
   (a) first, second, and third contact electrodes contacting the major surface of the wafer at first, second, and third mutually spaced-apart areas thereof;
   (b) first, second, and third mutually spaced-apart diffused regions of the wafer contacted by the first, second, and third contact electrodes, respectively;
   (c) first and second control electrodes overlying first and second channel regions, respectively, of the major surface, the first channel region situated in the space between the first and second spaced-apart areas, and the second channel region situated in the space between the second and third spaced-apart areas;
   (d) voltage source means, connected to the first and second control electrodes, for causing first and second inversion layers, respectively, to form at the major surface of the wafer in the first and second channel regions, respectively;
   (e) current source means, connected to the first or the second contact electrode, for causing a flow of current through the first diffused region, the first inversion layer, and the second diffused region;
   (f) voltage measuring means, connected across the second and third contact electrodes, for measuring the voltage developed across the second and third contact electrodes in response to the flow of current.

2. The integrated circuit wafer of claim 1 in which the first, second, and third diffused regions together with the first and second channel regions have an L shaped configuration.

3. A semiconductor integrated circuit wafer according to claim 2 in which the semiconductor is silicon.

4. The integrated circuit wafer of claim 3 in which the first, second, and third contact electrodes are essentially metal silicide.

5. A semiconductor integrated circuit wafer according to claim 1 in which the semiconductor is essentially silicon.

6. The integrated circuit wafer of claim 5 in which the first, second, and third contact electrodes are essentially metal silicide.

7. The integrated circuit wafer of claim 5 in which the first, second, and third diffused regions together with the first and second channel regions have an L shaped configuration.

8. The integrated circuit wafer of claim 5 in which the first and second control electrodes are first and second gate electrodes, respectively, that are spaced from the first and second channel regions, respectively, by first and second gate insulator layers, respectively.

9. The integrated circuit wafer of claim 8 in which the first and third contact electrodes extend laterally from sidewall insulating layers on the first and second gate electrodes, respectively, to sidewall insulating layers located on edges of a field insulator layer, and in which the second contact electrode extends laterally between sidewall insulating layers located on the first and second gate electrodes.

10. The integrated circuit wafer of claim 9 in which the first, second, and third diffused regions together with the first and second channel regions have an L shaped configuration.

11. The integrated circuit wafer of claim 9 in which the first, second, and third contact electrodes are essentially metal silicide.

12. The integrated circuit wafer of claim 11 in which the first, second, and third diffused regions together with the first and second channel regions have a L shaped configuration.

13. The integrated circuit wafer of claim 9 in which the first and third contact electrodes extend laterally from sidewall insulating layers on the first and second gate electrodes, respectively, to sidewall insulating layers located on edges of a field insulator layer, and in which the second contact electrode extends laterally between sidewall insulating layers located on the first and second gate electrodes.

14. The integrated circuit wafer of claim 13 in which the first, second, and third diffused regions together with the first and second channel regions have an L shaped configuration.

15. The integrated circuit of claim 9 in which the first gate electrode, the first and second contact electrodes, and the first and second diffused regions form a transistor structure that is identical to a transistor structure of the chip circuits.

16. The integrated circuit wafer of claim 9 in which the first, second, and third diffused regions, respectively, include the first, second and third mutually spaced-apart areas.

17. The integrated circuit wafer of claim 1 in which the chip circuits comprise a plurality of transistors mutually having the same structure as the transistor formed by the first control electrode, the first and second contact electrodes, and the first and second diffused regions.

18. The integrated circuit wafer of claim 1 in which the first, second, and third diffused regions, respectively, include the first, second and third mutually spaced-apart areas.

19. A semiconductor MOS integrated circuit wafer including chip circuits and a test circuit, located at a major surface of the semiconductor wafer, the test circuit comprising:
(a) first, second, and third contact electrodes contacting the major surface of the wafer at first, second, and third mutually spaced-apart areas thereof;
(b) first, second, and third mutually spaced-apart diffused regions of the wafer contacted by the first, and third contact electrodes respectively;
(c) first and second control electrodes overlying first and second channel regions, respectively, of the major surface, the first channel region situated in the space between the first and second spaced-apart areas, and the second channel region situated in the space between the second and third spaced-apart areas;
(d) voltage source means, connected to the first and second control electrodes, for causing first and second inversion layers, respectively, to form at the major surface of the wafer in the first and second channel regions, respectively;
(e) current source means, connected to the first or the second contact electrode, for causing a flow of current through the first diffused region, the first inversion layer, and the second diffused region;
(f) voltage measuring means, connected across the second and third contact electrodes, for measuring the voltage developed across the second and third contact electrodes in response to the flow of current.

* * * * *

UNITED STATES PATENT AND TRADEMARK OFFICE
CERTIFICATE OF CORRECTION

PATENT NO. : 4,896,108

DATED : January 23, 1990

INVENTOR(S) : William T. Lynch, Kwok-Kwok Ng

It is certified that error appears in the above-identified patent and that said Letters Patent is hereby corrected as shown below:

Column 12, lines 21-22, "first, and third" should read --first, second and third--.

Signed and Sealed this

Thirtieth Day of July, 1991

Attest:

HARRY F. MANBECK, JR.

*Attesting Officer*  *Commissioner of Patents and Trademarks*